United States Patent
Breil et al.

(10) Patent No.: US 9,859,403 B1
(45) Date of Patent: Jan. 2, 2018

(54) MULTIPLE STEP THIN FILM DEPOSITION METHOD FOR HIGH CONFORMALITY

(71) Applicant: GLOBALFOUNDRIES INC., Grand Cayman (KY)

(72) Inventors: Nicolas L. Breil, Beacon, NY (US); Neal A. Makela, Saratoga Springs, NY (US); Praneet Adusumilli, Albany, NY (US); Domingo A. Ferrer, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/174,147

(22) Filed: Jul. 22, 2016

(51) Int. Cl.
*H01L 29/417* (2006.01)
*H01L 29/66* (2006.01)
*H01L 29/04* (2006.01)
*H01L 29/08* (2006.01)
*H01L 21/285* (2006.01)
*H01L 29/78* (2006.01)

(52) U.S. Cl.
CPC .... *H01L 29/66795* (2013.01); *H01L 21/2855* (2013.01); *H01L 29/045* (2013.01); *H01L 29/0847* (2013.01); *H01L 29/41791* (2013.01); *H01L 29/785* (2013.01); *H01L 2029/7858* (2013.01)

(58) Field of Classification Search
CPC .............. H01L 29/045; H01L 29/0847; H01L 29/41791; H01L 21/2855; H01L 29/785; H01L 2029/7858
See application file for complete search history.

(56) References Cited

U.S. PATENT DOCUMENTS

| | | |
|---|---|---|
| 5,173,450 A | 12/1992 | Wei |
| 5,187,122 A | 2/1993 | Bonis |
| 5,403,759 A | 4/1995 | Havemann |
| 5,635,426 A | 6/1997 | Hayashi et al. |
| 5,913,139 A | 6/1999 | Hashimoto et al. |
| 6,077,779 A | 6/2000 | Shue et al. |
| 6,281,072 B1 | 8/2001 | Li et al. |
| 6,867,086 B1 | 3/2005 | Chen et al. |
| 6,969,677 B2 | 11/2005 | Derderian et al. |
| 7,425,500 B2 | 9/2008 | Metz et al. |
| 7,791,109 B2 | 9/2010 | Wann et al. |
| 8,362,574 B2 | 1/2013 | Kawasaki et al. |
| 8,896,063 B2 | 11/2014 | Adam et al. |
| 9,224,675 B1 | 12/2015 | DeHaven et al. |
| 9,324,820 B1* | 4/2016 | Kelly .............. H01L 21/823437 |
| 2003/0066747 A1 | 4/2003 | Sundarrajan et al. |
| 2003/0160235 A1 | 8/2003 | Hirai |
| 2004/0140196 A1 | 6/2004 | Gopalraja et al. |
| 2011/0001169 A1 | 1/2011 | Ozcan et al. |

(Continued)

FOREIGN PATENT DOCUMENTS

WO 2011109337 A2 9/2011
WO 2013101790 A2 7/2013

*Primary Examiner* — Long Pham
(74) *Attorney, Agent, or Firm* — Scully Scott Murphy and Presser; Frank Digiglio (57) ABSTRACT

During a physical vapor deposition (PVD) process, the ion energy of a depositing species is controlled. By varying the ion energy throughout the process, the degree of conformality of the deposited layer over three-dimensional structures, including the extent to which the deposited layer merges between adjacent structures can be controlled.

19 Claims, 8 Drawing Sheets

(56) References Cited

U.S. PATENT DOCUMENTS

2011/0209995 A1* 9/2011 Rasheed .......... H01J 37/32091
                                                    204/298.08
2015/0079751 A1* 3/2015 Alptekin ............... H01L 29/785
                                                    438/283

* cited by examiner

MULTIPLE STEP THIN FILM DEPOSITION METHOD FOR HIGH CONFORMALITY

BACKGROUND

The present application relates generally to semiconductor device processing, and more specifically to conformal thin film architectures and their methods of production.

Fully-depleted devices such as fin field effect transistors (FinFETs) are candidates to enable scaling of next generation gate lengths to 14 nm and below. As contact dimensions decrease, however, there is a corresponding increase in contact resistance that poses a challenge to device development.

Merging fins (i.e., at respective source and drain regions) enables partial strapping of the contact plugs, which provides reduced contact resistance without excessively increasing parasitic capacitance. However, due to the narrow dimensions of the device, it is difficult to merge fins without consuming the silicon reservoir of the fins themselves. Moreover, achieving conformal coverage of deposited layers over three-dimensional structures is important in engineering robust device designs having enhanced performance.

In view of the foregoing, it would be advantageous to develop a deposition method to provide controlled conformality of deposited layers, which may additionally be used to enhance or suppress the merging of adjacent structures.

SUMMARY

In accordance with embodiments of the present application, the ion energy during a physical vapor deposition (PVD) process is controlled by modulating the substrate impedance. By varying the ion energy throughout the process, geometric shadowing, angle-of-incidence, and sputtering effects inherent to line-of-sight deposition can be balanced to increase or decrease conformality of the deposited layer over three-dimensional structures and merge or unmerge adjacent features.

A method of forming a semiconductor structure within a vacuum chamber includes plasma depositing a first portion of a conductive layer over raised regions disposed on a semiconductor substrate at a first ion energy, and plasma depositing a second portion of the conductive layer over the first portion at a second ion energy.

A further method of forming a semiconductor structure includes forming a plurality of semiconductor fins on a substrate, and forming a plurality of raised active regions on the semiconductor fins. Within a vacuum chamber, a first portion of a conductive layer is plasma deposited over the raised active regions at a first ion energy, and a second portion of the conductive layer is plasma deposited over the first portion at a second ion energy.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Reference will now be made in greater detail to various embodiments of the subject matter of the present application, some embodiments of which are illustrated in the accompanying drawings. The same reference numerals will be used throughout the drawings to refer to the same or similar parts.

Embodiments of the application relate generally to the manufacture of semiconductor devices, and more particularly to the manufacture of fin field effect transistors (FinFETs), although it will be appreciated that the methods and structures described herein may be applied to other device architectures.

Figure 1:
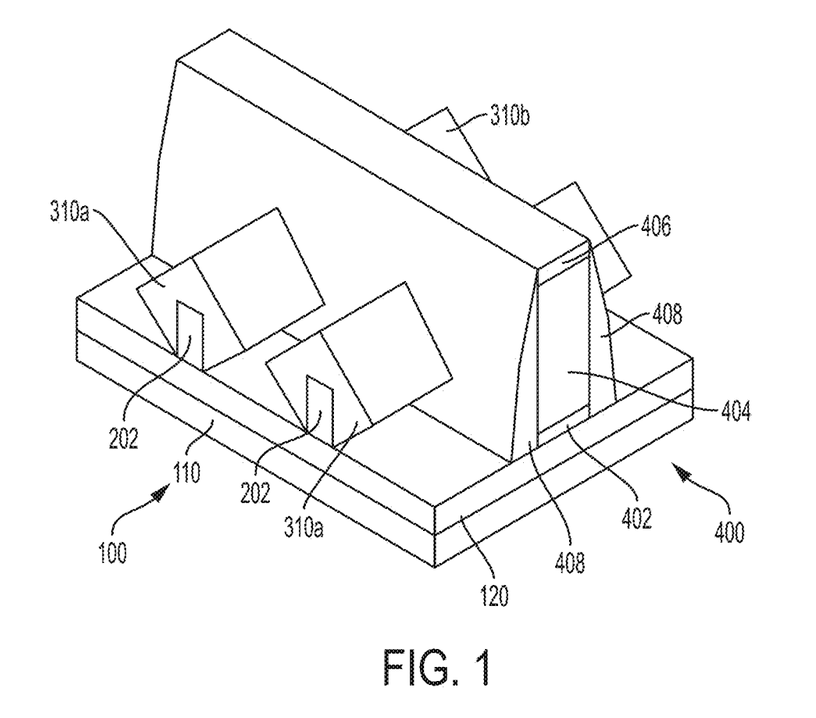
FIG. 1 is a perspective view of a semiconductor device architecture at an intermediate stage of fabrication according to various embodiments.

With reference to FIG. 1, a semiconductor structure includes a substrate 100 having a plurality of fins 202 formed on an isolation layer 120 of the substrate. Epitaxial source and drain raised active regions 310a, 310b are formed over the fins 202 at opposing ends thereof, while a gate stack 400 is formed over the fins 202 defining a channel region between the source and drain regions.

Substrate 100 may be a semiconductor material such as silicon or a silicon-containing material, including a bulk substrate. Thus, according to various embodiments, a plurality of fins may be formed on a bulk substrate. Silicon-containing materials include, but are not limited to, single crystal Si, polycrystalline Si, single crystal silicon germanium (SiGe), polycrystalline silicon germanium, silicon doped with carbon (Si:C), amorphous Si, as well as combinations and multi-layers thereof. Example silicon substrates include silicon-on-insulator (SOI) substrates, silicon-on-sapphire (SOS) substrates, and the like. As used herein, the term "single crystal" denotes a crystalline solid, in which the crystal lattice of the entire sample is substantially continuous and substantially unbroken to the edges of the sample with substantially no grain boundaries.

Substrate 100 is not limited to silicon-containing materials, as the substrate 100 may include other semiconductor materials, including Ge and compound semiconductors such as GaAs, InAs and other like semiconductors.

The isolation layer 120 may include the buried oxide (BOX) layer of a semiconductor-on-insulator (SOI) substrate, or an oxidized layer of a bulk silicon substrate. The thickness of the isolation layer 120 may range from 30 to 300 nm, e.g., 30, 50, 100, 150, 200, 250 or 300 nm, including ranges between any of the foregoing values. The isolation layer 120 may include, for example, silicon dioxide ($SiO_2$). Alternatively, isolation layer 120 may include silicon nitride, silicon oxynitride, a low-k material, or any suitable combination of these materials. The isolation layer 120 may be deposited by plasma enhanced chemical vapor deposition (PECVD).

Exemplary low-k materials include but are not limited to, amorphous carbon, fluorine-doped oxides, carbon-doped oxides, SiCOH or SiBCN. Commercially-available low-k dielectric products and materials include Dow Corning's SiLK™ and porous SiLK™, Applied Materials' Black Diamond™, Texas Instrument's Coral™ and TSMC's Black Diamond™ and Coral™. As used herein, a low-k material has a dielectric constant less than that of silicon oxide.

The substrate 100 may have dimensions as typically used in the art. Example substrate diameters include, but are not limited to, 50, 100, 150, 200, 300 and 450 mm. The total substrate thickness may range from 250 microns to 1500 microns, although in particular embodiments the substrate thickness is in the range of 725 to 775 microns, which corresponds to thickness dimensions commonly used in silicon CMOS processing. The supporting substrate 110 may include (100)-oriented silicon or (111)-oriented silicon, for example.

Fins 202 may be etched (i.e., patterned) from the substrate. The patterning process may include photolithography, which includes forming a layer of photoresist material (not shown) atop a material or material stack to be patterned. The photoresist material may include a positive-tone photoresist composition, a negative-tone photoresist composition, or a hybrid-tone photoresist composition. A layer of photoresist material may be formed by a deposition process such as, for example, spin-on coating.

The deposited photoresist is then subjected to a pattern of irradiation, and the exposed photoresist material is developed using a conventional resist developer. The pattern provided by the patterned photoresist material is thereafter transferred into the underlying material layer or material layers utilizing at least one pattern transfer etching process.

The pattern transfer etching process may be an isotropic etch or an anisotropic etch. In embodiments, a dry etching process such as, for example, reactive ion etching (RIE) can be used. In other embodiments, a wet chemical etchant can be used. In still further embodiments, a combination of dry etching and wet etching can be used. The pattern transfer etching may stop on the isolation layer 120, or a portion of the isolation layer 120 may be removed during the formation of the fins 202.

In embodiments, fins 202 are formed from a crystalline semiconductor material. The semiconductor material forming fins 202 may be doped, undoped, or contain doped and undoped regions therein. Each doped region within the semiconductor fins 202 may have the same or different doping concentrations and/or conductivities. Doped regions that are present can be formed, for example, by an ion implantation process or by gas phase doping.

In another embodiment, the patterning process may include a sidewall image transfer (SIT) process. The SIT process includes forming a mandrel material layer (not shown) atop the material or material layers (i.e., crystalline silicon) that is to be patterned. The mandrel material layer can include any material (semiconductor, dielectric or conductive) that can be selectively removed from the structure during a subsequently performed etching process. For instance, the mandrel material layer may be composed of amorphous silicon or polysilicon. In another embodiment, the mandrel material layer may be composed of a metal such as, for example, Al, W, or Cu. The mandrel material layer can be formed, for example, by chemical vapor deposition or plasma enhanced chemical vapor deposition. Following deposition of the mandrel material layer, the mandrel material layer can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may include any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that can be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material. Following the mandrel structure removal, the pattern provided by the dielectric spacers is transferred into the underlying material or material layers. The pattern transfer may be achieved by at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

As used herein, a "fin" refers to a contiguous semiconductor material and includes a pair of vertical sidewalls that are parallel to each other. As used herein, a surface is "vertical" if there exists a vertical plane from which the surface does not deviate by more than three times the root mean square roughness of the surface. Each of a plurality of fins 202 can include a single crystal semiconductor material that extends along a lengthwise direction. As used herein, a "lengthwise direction" is a horizontal direction along with an object extends the most. A "widthwise direction" is a horizontal direction that is perpendicular to the lengthwise direction.

In embodiments, the as-formed fins 202 are free standing, i.e., supported only by the substrate 100. In the case of fins that are formed on an SOI substrate, the fin height is measured normal to the major surface of the substrate from the top of isolation layer 120 to the top of the fin. In the case of fins that are formed on a bulk substrate, the fin height is measured normal to the major surface of the substrate from the top of an isolation layer disposed between adjacent fins to the top of the fin. Each fin has a height (H) that may range from 10 nm to 100 nm and a width (W) that may range from 4 nm to 30 nm. Other heights and widths that are less than or greater than the ranges mentioned can also be used. In structures comprising plural fins, each fin may be spaced apart from its nearest neighbor by a pitch (i.e., repeat distance) of 20 nm to 100 nm. Such plural fins are typically oriented parallel to each other.

In embodiments, each of a plurality of semiconductor fins 202 extends along a lengthwise direction with a substantially rectangular vertical cross-sectional shape. As used herein, a "substantially rectangular shape" is a shape that differs from a rectangular shape only due to atomic level roughness that does not exceed 2 nm. The substantially rectangular vertical cross-sectional shape is a shape within a plane including a vertical direction and a widthwise direction.

The supporting substrate 110 and the insulator layer 120 may collectively function as a substrate on which the plurality of semiconductor fins 202 are disposed. The substantially rectangular vertical cross-sectional shape adjoins a horizontal interface with a top surface of the insulator layer 120. A shown in FIGS. 1 and 2, each fin 202 has a bottom surface that is disposed directly on a top surface of the substrate, which may be the insulator layer 120 of an SOI substrate. Plural fins may have identical or substantially identical dimensions, i.e., height and/or width. As used herein, substantially identical dimensions vary by less than 10%, e.g., less than 5%, 2% or 1%.

With reference still to FIG. 1, formed over a portion of fins 202 is a gate stack 400, which includes a gate dielectric 402, a gate electrode 404, and a gate cap 406. Sidewall spacers 408 may be formed on the sides of the gate stack 400. Gate stack 400 is formed generally orthogonal to the length-wise dimension of the fins 202.

The gate dielectric 402 may be a conformal layer that is formed over exposed surfaces of the fins 202 and substrate 100, and may be deposited by a suitable process such as atomic layer deposition (ALD), chemical vapor deposition (CVD), physical vapor deposition (PVD), thermal oxidation, UV-ozone oxidation, or combinations thereof.

The formation of the gate dielectric 402, the gate electrode 404, and the gate cap 406 can be effected, for example, by deposition of a stack of a gate dielectric layer, a gate electrode layer, and a gate cap dielectric layer, and by subsequent patterning of the gate cap dielectric layer, the gate electrode layer, and the gate dielectric layer. Patterning of the gate cap dielectric layer and the gate electrode layer can be performed using a combination of lithographic methods and at least one anisotropic etch. Patterning of the gate dielectric layer can be performed using an isotropic etch that is selective to the semiconductor material used to form semiconductor fins 202.

Gate dielectric 402 may include silicon oxide, silicon nitride, silicon oxynitride, a high-k dielectric, or other suitable material. As used herein, a high-k material has a dielectric constant greater than that of silicon oxide. A high-k dielectric may include a binary or ternary compound such as hafnium oxide ($HfO_2$). Further exemplary high-k dielectrics include, but are not limited to, $ZrO_2$, $La_2O_3$, $Al_2O_3$, $TiO_2$, $SrTiO_3$, $BaTiO_3$, $LaAlO_3$, $Y_2O_3$, $HfO_xN_y$, $HfSiO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiO_xN_y$, $SiN_x$, a silicate thereof, and an alloy thereof. Each value of x may independently vary from 0.5 to 3, and each value of y may independently vary from 0 to 2.

The gate dielectric thickness may range from 1 nm to 10 nm, e.g., 1, 2, 4, 6, 8 or 10 nm, including ranges between any of the foregoing.

A gate electrode 404 is formed over the gate dielectric 402, and a gate cap 406 is formed over the gate electrode 404. The gate electrode 404 may include a conductive material such as polysilicon, silicon-germanium, a conductive metal such as Al, W, Cu, Ti, Ta, W, Pt, Ag, Au, Ru, Ir, Rh and Re, alloys of conductive metals, e.g., Al—Cu, silicides of a conductive metal, e.g., W silicide, and Pt silicide, or other conductive metal compounds such as TiN, TiC, TiSiN, TiTaN, TaN, TaAlN, TaSiN, TaRuN, WSiN, NiSi, CoSi, as well as combinations thereof. The gate electrode 404 may include one or more layers of such materials such as, for example, a metal stack including a work function metal layer and/or a liner.

The gate electrode 404 can be formed utilizing a conventional deposition process such as, for example, ALD, CVD, metalorganic chemical vapor deposition (MOCVD), molecular beam epitaxy (MBE), sputtering, plating, evaporation, ion beam deposition, electron beam deposition, laser assisted deposition, or chemical solution deposition.

The gate spacers 408 can be formed around the gate stack 402, 404, 406. The gate spacers 408 can be formed, for example, by depositing a conformal dielectric material layer on the plurality of semiconductor fins 202 and the gate stack, and anisotropically etching the conformal dielectric layer. The anisotropic etch may include an over-etch component that removes vertical portions of the conformal dielectric material layer from the sidewalls of the plurality of semiconductor fins 202. An upper portion of the gate cap dielectric 406 can be vertically recessed during the over-etch of the conformal dielectric material layer. The remaining portions of the conformal dielectric material layer constitute the gate spacers 408, which laterally surround the gate stack 402, 404, 406.

The semiconductor structure may be fabricated using a gate first process or a gate last (i.e., replacement metal gate) process. In a gate first process, as described above, metal layers are formed and patterned to form gate structures follow by CMOS processing such as formation of the source and drain, spacers, and interlayer dielectric. In a gate last process, a sacrificial gate structure is formed followed by CMOS processing. Thereafter, the sacrificial gate structure is removed followed by the formation of a replacement gate structure.

Figure 2:
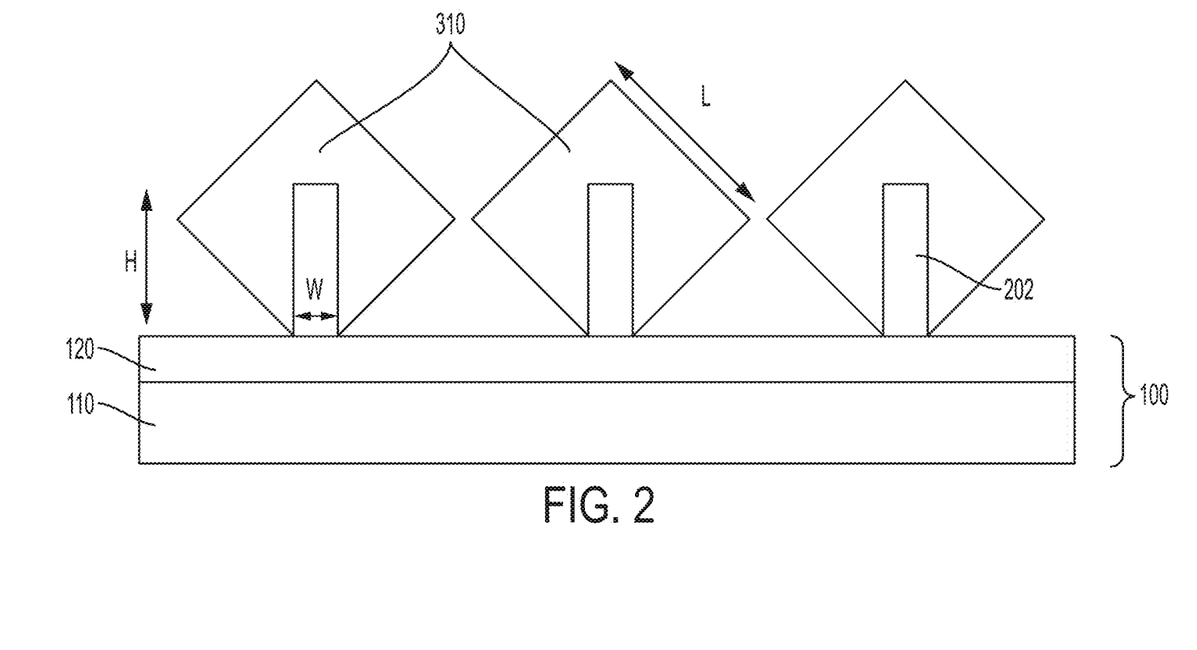
FIG. 2 is a cross-sectional schematic view of a semiconductor device architecture after the formation of a diamond-shaped epitaxial layer over exposed surfaces of adjacent fins.

Referring now to FIG. 2, a plurality of raised active regions 310 are formed on the plurality of semiconductor fins 202. As used herein, a "raised active region" refers to a doped semiconductor material portion that protrudes above a topmost surface of an active region of a semiconductor device. An active region refers to a semiconductor material portion within a semiconductor device through which charge carriers flow during operation of the device. A "raised region" refers to a material portion that protrudes above a planar surface. As seen in the perspective view of FIG. 1, the plurality of the raised active regions include raised source regions 310a that are formed on a source side of the fins 202 with respect to the gate stack 402, 404, 406, and raised drain regions 310b that are formed on a drain side of the fins 202 with respect to the gate stack 402, 404, 406.

Pre-merged raised active regions 310 are formed over opposing end portions of the fins 202. The epitaxial growth naturally forms into shaped structures (referred to as diamond-shaped structures hereafter). The faceted shape results from the different relative growth rates over different crystallographic orientations. For example, the growth rate on silicon (Si) surfaces having (111) orientations is slower than that on other planes such as (110) or (100) planes. Accordingly, the resultant diamond-shaped structures result from the slowest epitaxial growth rate on the (111) surface.

In the illustrated embodiment, the vertical surfaces of the fins 202 have a (110) crystallographic orientation, while the horizontal top surfaces have a (100) orientation. The faceted top surfaces of the raised active regions 310 have a (111) orientation. The angle between the (111) surface and (110) surface is 35.3°, and the angle between (111) surface and the (100) surface 54.7°. In embodiments, lengths (L) of the facets are substantially the same and can be controlled by the epitaxial growth process conditions, such as growth rate and growth time. Compared to a rectangular shape, the diamond-shaped raised active regions 310 have the advantage of a greater surface area and volume in the active regions, and the flexibility of a multi-layer fin structure (e.g., SiGe diamonds on Si fins).

Example epitaxial growth processes include low energy plasma deposition, liquid phase epitaxy, molecular beam epitaxy, and atmospheric pressure chemical vapor deposition. The terms "epitaxy," "epitaxial" and/or "epitaxial growth and/or deposition" refer to the growth of a semiconductor material layer on a deposition surface of a semiconductor material, in which the semiconductor material layer being grown assumes the same crystalline habit as the semiconductor material of the deposition surface. For example, in an epitaxial deposition process, chemical reactants provided by source gases are controlled and the system parameters are set so that depositing atoms alight on the deposition surface and remain sufficiently mobile via surface diffusion to orient themselves according to the crystalline orientation of the atoms of the deposition surface. Therefore, an epitaxial semiconductor material has the same crystalline characteristics as the deposition surface on which it is formed. For example, an epitaxial semiconductor material deposited on a (100) crystal surface will take on a (100) orientation.

The epitaxial source and drain regions may be doped. Doping changes the electron and hole carrier concentrations of an intrinsic semiconductor at thermal equilibrium. A doped layer or region may be p-type or n-type. For instance, if the plurality of semiconductor fins 202 are doped with dopants of a first conductivity type, e.g., prior to formation of the gate stack, the plurality of raised active regions 310 can be doped with dopants of a second conductivity type, which is the opposite of the first conductivity type. If the first conductivity type is p-type, the second conductivity type is n-type, and vice versa.

As used herein, "p-type" refers to the addition of impurities to an intrinsic semiconductor that creates a deficiency of valence electrons. For silicon, example p-type dopants, i.e., impurities, include but are not limited to, boron, aluminum, gallium, and indium. As used herein, "n-type" refers to the addition of impurities that contribute free electrons to an intrinsic semiconductor. For silicon, example n-type dopants, i.e., impurities, include but are not limited to, antimony, arsenic, and phosphorus. The dopant(s) may be introduced by ion implantation, plasma doping. For instance, a low energy implant process (e.g., at 1 keV or less) can be used to implant arsenic or boron. Alternatively, dopant(s) may be introduced in situ, i.e., during a process sequence used to form the layer.

By way of example, a dopant region may be implanted with arsenic or phosphorus to form an n-type region. The dopant concentration within the source and drain regions may range from $1 \times 10^{19}$ atoms/cm$^3$ to $1 \times 10^{22}$ atoms/cm$^3$, e.g., $1 \times 10^{20}$ atoms/cm$^3$ to $1 \times 10^{21}$ atoms/cm$^3$. In another example, a dopant region is implanted with boron or BF$_2$ to form a p-type region. The dopant concentration within the source and drain regions may range from $1 \times 10^{19}$ atoms/cm$^3$ to $1 \times 10^{22}$ atoms/cm$^3$, e.g., $1 \times 10^{20}$ atoms/cm$^3$ to $1 \times 10^{21}$ atoms/cm$^3$.

An optional drive-in anneal can be used to diffuse dopant species and generate a desired dopant profile. In embodiments, dopant atoms within the source and drain raised active regions 310a, 310b may be diffused into the fins 202 using a post-epitaxy anneal (e.g., at a temperature of 600° C. to 1400° C.) to create a desired dopant profile within the fins proximate to the source and drain regions.

The portion of each semiconductor fin 202 that is not converted into a source region or a drain region constitutes a channel region. The channel regions collectively function as a channel of a field effect transistor. The source regions including raised source regions 310a collectively function as a source of the field effect transistor. The drain regions including raised drain regions 310b collectively function as a drain of the field effect transistor.

As formed, adjacent raised active regions 310, i.e., raised active regions 310 formed over adjacent fins 202, may or may not merge. Merging of the diamond-shaped epitaxy depends on a number of factors, including the height, width and spacing of the fins 202 and the thickness of the epitaxial layers. Unmerged raised active regions 310 are illustrated in FIG. 2.

Figure 3:
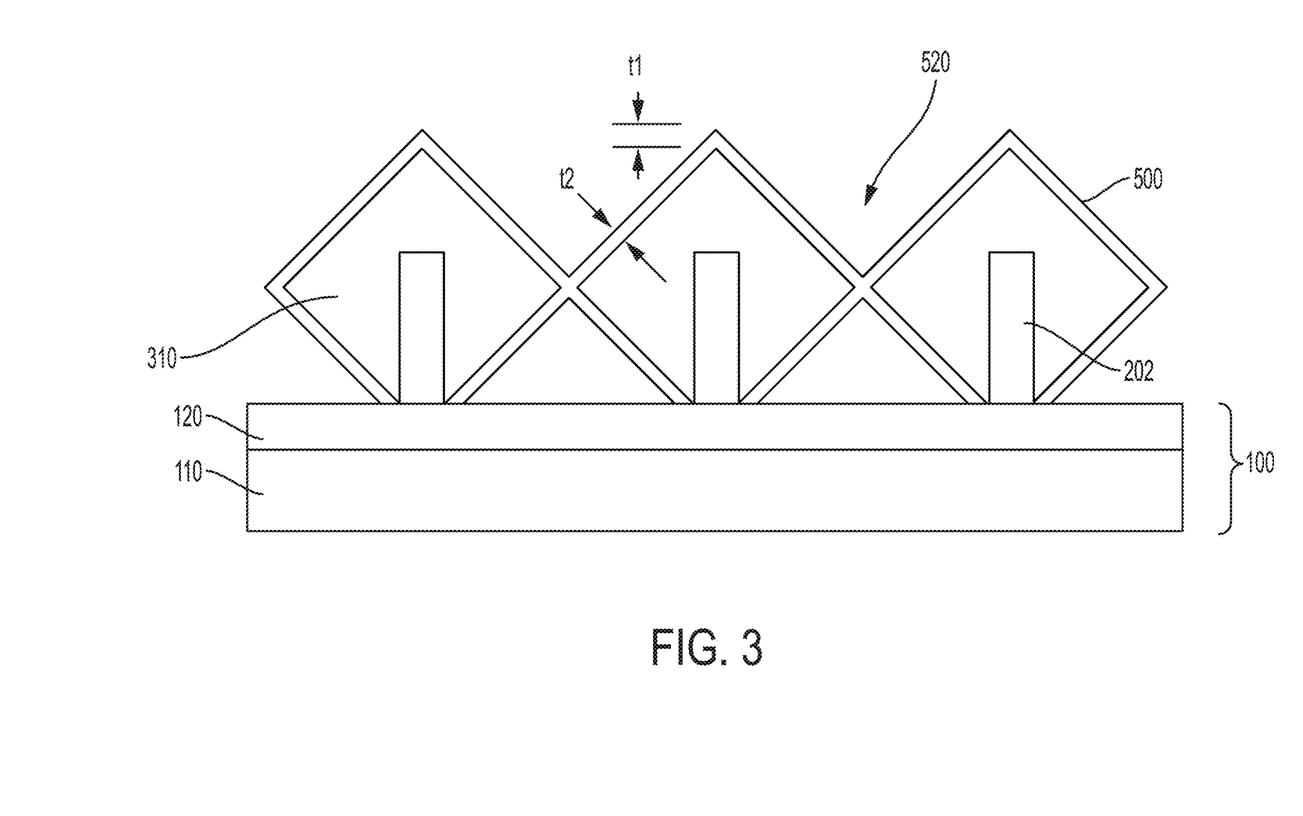
FIG. 3 is a cross-sectional schematic view of a semiconductor device architecture after the formation of a conformal layer over the epitaxial layer of FIG. 2.

As seen with reference to FIG. 3, one or more conductive layers 500 are deposited over the raised active regions 310. Conductive layers 500 may provide an ohmic contact to the source and drain raised active regions 310a, 310b and may promote a uniform as well as low contact resistance. As explained in further detail below, conductive layers 500 may be used to merge adjacent and otherwise unmerged raised active regions 310. In the illustrated embodiment, conductive layers 500 at least partially overlap and thus merge in regions 520.

In embodiments, at least a portion of conductive layer 500 is formed by physical vapor deposition (PVD), i.e., sputtering. The physical vapor process can be used to form high-purity metal and metal alloy layers. For instance, the concentration in sputtered layers of impurities such as oxygen and halides such as chlorine can be less than 500 ppm, e.g., less than 200, 100, 50 or 10 ppm. By way of comparison, the oxygen and chlorine content in a comparative titanium metal layer formed by chemical vapor deposition are about 1 at. % and 2 at. %, respectively.

The conductive layer 500 may include a conductive material such as polysilicon, silicon-germanium, a conductive metal such as Al, W, Cu, Ti, Ta, W, Pt, Ag, Au, Ru, Ir, Rh and Re, alloys of conductive metals, e.g., Al—Cu, silicides of a conductive metal, e.g., W silicide, and Pt silicide, or other conductive metal compounds such as TiN, TiC, TiNb, TiSiN, TiTaN, TaN, TaAlN, TaSiN, TaRuN, WSiN, NiSi, CoSi, as well as combinations thereof.

Sputtering or sputter deposition is a process where particles are ejected from a solid target material due to bombardment of the target by energetic particles. The primary particles for the sputtering process can be supplied in a number of ways, for example by a plasma (e.g., diode or magnetron sputtering) or an ion source (e.g., ion beam deposition).

Figure 4A:
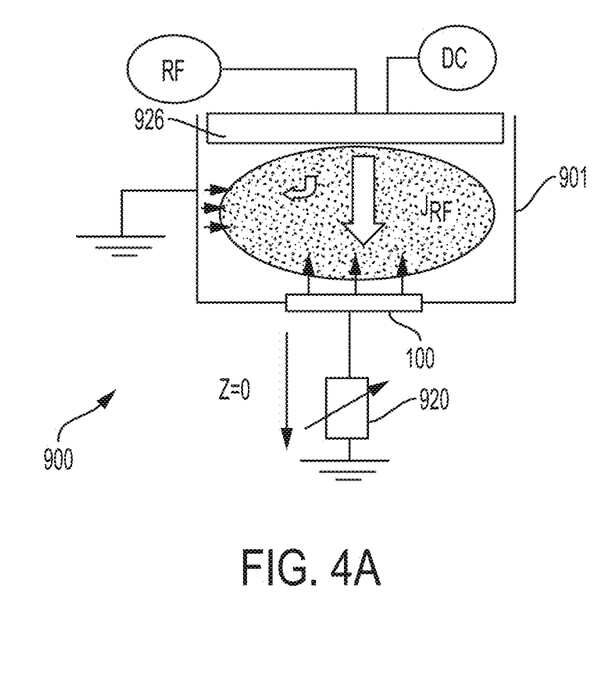
FIGS. 4A and 4B illustrate a physical vapor deposition apparatus that may be used in conjunction with various embodiments.
Figure 4B:
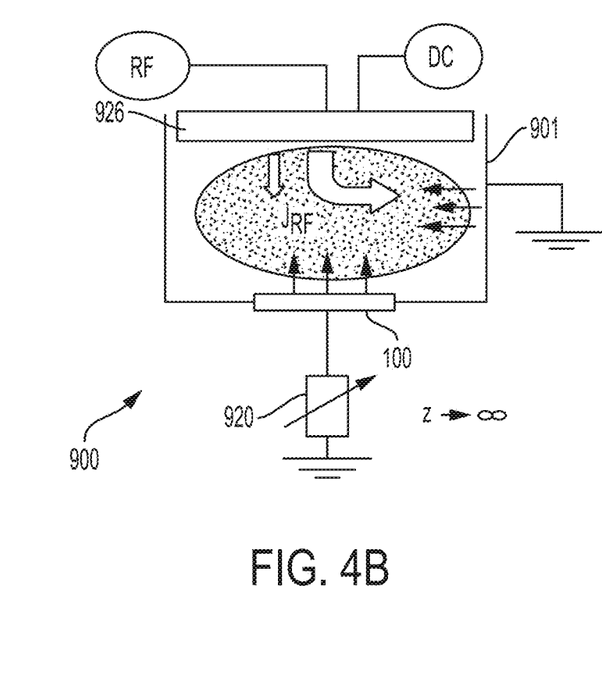

An example sputter apparatus for forming one or more PVD layers is shown schematically in FIGS. 4A and 4B. Apparatus 900 may be a combined radio frequency (RF)-direct current (DC) magnetron sputtering system, for example. As will be appreciated, apparatus 900 may be a stand-alone system or be part of a cluster tool adapted to perform multiple deposition and/or etch functions. In general, apparatus 900 includes an outer enclosure in the form of a vacuum chamber, which contains an inner, plasma-confining enclosure or sheath (collectively 901). The plasma-confining enclosure and/or outer enclosure may be grounded. During operation, an ion plasma is generated within the ion plasma-confining enclosure by at least one independently powered anode-cathode pair. Sputter target (or cathode) 926 is mounted within the inner enclosure, and substrate (or anode) 100 is mounted for the receipt of sputtered material from target 926 on a pedestal or susceptor, which is connected to impedance-matching network 920 as known to those skilled in the art.

According to embodiments, the ion energy of the deposited species (e.g., Ti) is modulated during the deposition. Thus, the deposition conditions are adjusted in order to affect a change (e.g., increase or decrease) in ion energy throughout the deposition. The increase or decrease in ion energy may be continuous (i.e., monotonic) or discontinuous (i.e., stepped).

An increase or decrease in the incident ion energy may be controlled by a respective decrease or increase in the substrate impedance (Z). Changing the substrate impedance changes the voltage (i.e., self-bias voltage or SBV) between the plasma and the substrate. Although the ion energy may be increased or decreased, according to exemplary embodiments, one or both of the chamber pressure and the applied power are held constant during sputtering.

In exemplary sputter systems, the impedance-matching network 920 includes a variable capacitor. When the variable capacitor changes position, the impedance to ground through the substrate varies. During sputtering, a voltage is induced on the substrate by the processing conditions and geometry of the system. The voltage induced on the substrate (self-bias voltage) is reported as the center tap voltage, which is measured from the center of backside of the substrate.

Without wishing to be bound by theory, as the substrate impedance to ground decreases, RF current ($J_{RF}$) through the substrate will be high, which yields a high sheath voltage, low self-bias voltage, and a relatively high ion energy (FIG. 4A). The high current flux through the substrate may induce heating of the substrate. On the other hand, as the substrate impedance to ground increases, RF current through the substrate will be low as more RF current is directed to the wall sheath. The attendant sheath voltage will be close to the system's floating voltage, the self-bias voltage will be high, and the ion energy will be low (FIG. 4B).

According to various embodiments, these disparate process conditions (i.e., high incident ion energy and low incident ion energy) can be manipulated to control the conformality of a sputtered thin film.

Figure 5:
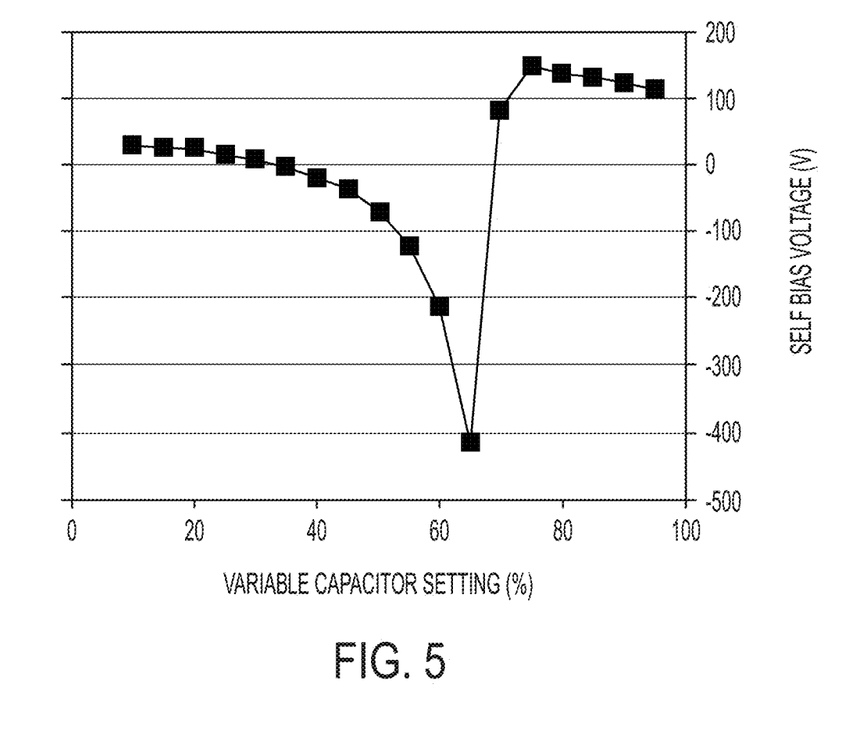
FIG. 5 is a plot of self-bias voltage as a function of the setting of a variable capacitor.

When using the sputtering apparatus 900 in a device manufacturing process, the self-bias voltage may range from −500V to 200V. In various embodiments, high ion energies correspond to a self-bias voltage of −50 to 90V, e.g., −50, −40, −30, −20, −10, 0, 10, 20, 40, 60, 80 or 90V, including ranges between any of the foregoing values, while low ion energies correspond to a self-bias voltage of 100 to 200V, e.g., 100, 125, 150, 175 or 200V, including ranges between any of the foregoing values. Without wishing to be bound by theory, it was unexpectedly determined that resonant instabilities within the process chamber, which challenge process reproducibility, are associated with intermediate settings of the variable capacitor. The effect of the variable capacitor setting on the self-bias voltage can be seen with reference to FIG. 5, which illustrates that relatively large changes in the self-bias voltage are associated with relatively small changes in the variable capacitor setting over the range of 30% to 70%. Accordingly, in certain embodiments, stable high ion energies can be achieved using a variable capacitor setting of 10 to 25%, while stable low ion energies can be achieved using a variable capacitor setting of 75 to 95%.

Figure 6A:
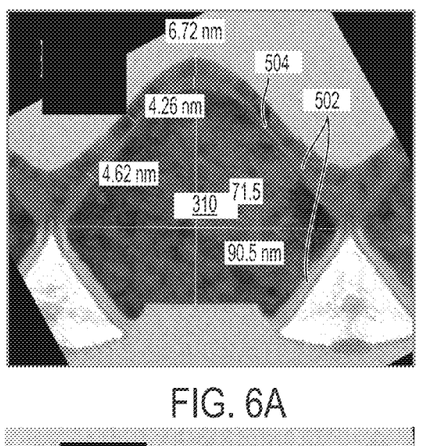
FIGS. 6A and 6B are cross-sectional transmission electron microscope (TEM) micrographs showing the formation of conductive layers over a diamond-shaped epitaxial layer using a high ion energy deposition process.
Figure 6B:
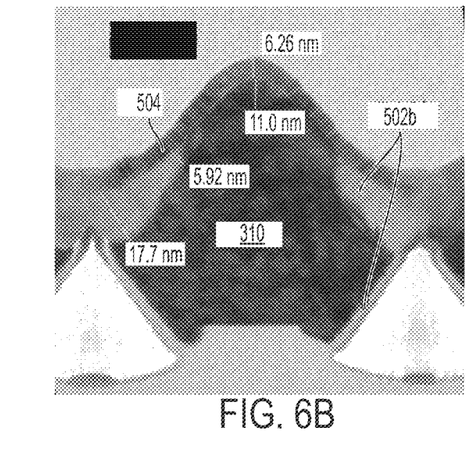
Figure 7A:
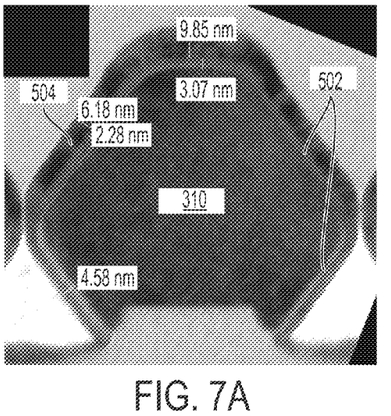
FIGS. 7A and 7B are cross-sectional transmission electron microscope (TEM) micrographs showing the formation of conductive layers over a diamond-shaped epitaxial layer using a low ion energy deposition process.
Figure 7B:
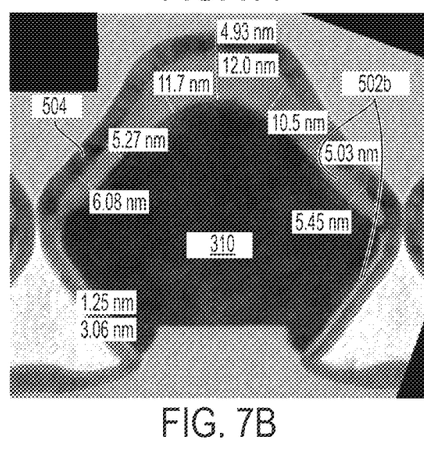

Turning to FIGS. 6 and 7, depicted are the effects of incident ion energy on the conformality of a metal (Ti) layer 502 deposited onto three-dimensional, diamond-shaped raised active regions 310. Depositions are performed using a combined radio frequency (RF)-direct current (DC) magnetron sputtering system. For each case, the RF and DC power are held constant at 1000 W and 4500 W, respectively. The target titanium thickness is 6 nm, and a capping layer of titanium nitride (TiN) having a target thickness of 3.5 nm is deposited by atomic layer deposition over the sputtered titanium prior to a laser anneal. FIGS. 6A and 7A shown the morphology of the as-deposited (titanium and titanium nitride) layers, while FIGS. 6B and 7B show the structure (including titanium silicide and titanium nitride layers) following a 900° C. laser anneal. The thickness of the conductive layer 500 may be selected such that, in conjunction with the deposition parameters, the metal layers 500 merge to form respective source-side and/or drain side contiguous structures.

In embodiments, laser annealing includes irradiating the conductive layer 500 with a pulsed laser beam while a parameter of the beam, such as the intensity and/or pulse width, is regulated to suitably heat the conductive layer 500. By virtue of the laser annealing, at least a portion of the metal layer 502 reacts with silicon to form a metal silicide layer 502b. For instance, a titanium (Ti) metal layer 502 may react with the silicon (Si) raised active regions 310 to form titanium silicide (e.g., $TiSi_2$) 502b. In various embodiments, dynamic surface annealing (DSA) can be used in lieu of laser annealing.

As illustrated, and according to various embodiments, titanium metal is deposited preferentially at the diamond lateral tips with a high ion energy condition, whereas the deposition rate is higher and the net accumulation is greater at the diamond apex with a low ion energy condition. In embodiments, adjustment of the ion energy is accomplished by changing the substrate impedance.

Thus, under conditions of high ion energy (FIG. 6), the net deposition rate and hence the final thickness of the titanium layer are exaggerated near the lateral edges of the diamond-shaped structures, which results in merging of adjacent titanium silicide layers (i.e., layers disposed over adjacent raised active regions 310). The net deposition rate at the diamond apex is significantly lower, which is believed to be due to the combined effects of deposition and re-sputtering during deposition. In the illustrated example, the post-anneal thickness of the titanium silicide layer 502b at the diamond apex is 11 nm (t1), while the corresponding maximum thickness at the lateral edge of the diamond structure is 17.7 nm (t2). Following high ion energy deposition conditions, the stoichiometry of the titanium silicide layer is $TiSi_{2.17}$.

Turning to FIG. 7, under conditions of low ion energy, deposition on the top surfaces of the diamond-shaped structure is more conformal. In the illustrated example, the post-anneal thickness of the titanium silicide layer 502b at the diamond apex is 12 nm (t1), while the corresponding thickness at the lateral edge of the diamond-shaped structure is 5.45 nm (t2). The titanium silicide layer 502b is not merged between adjacent diamond-shaped structures. Following low ion energy deposition conditions, the stoichiometry of the titanium silicide layer is $TiSi_{2.19}$.

Figure 8:
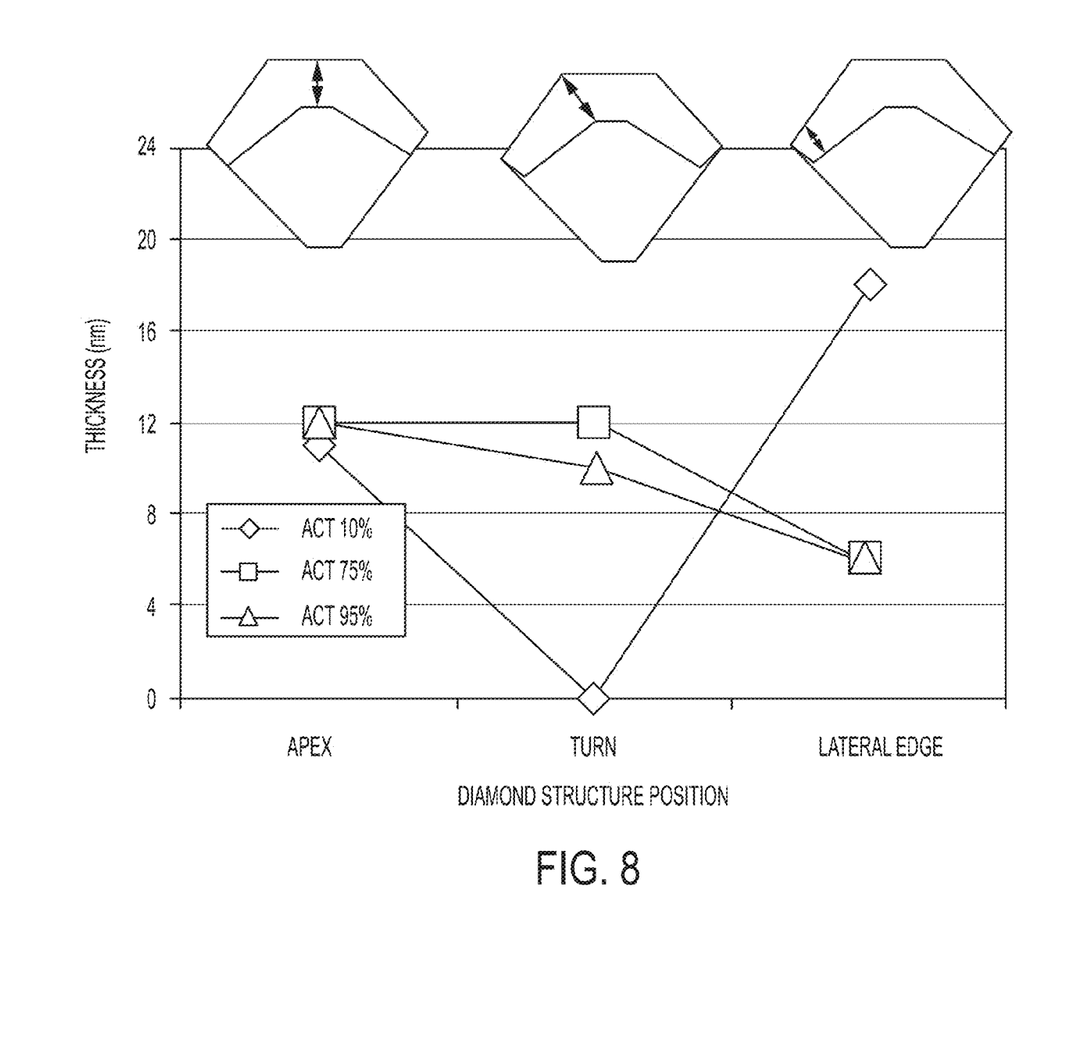
FIG. 8 is a plot of conductive layer thickness over a diamond-shaped epitaxial layer as a function of ion energy and location.

FIG. 8 is a plot of post-anneal conductive layer thickness at various locations over the top facets of the diamond-shaped structure for depositions performed at high energy and low energy. The location of the apex, turn and lateral edge of the conductive layer on a facet top surface are annotated in FIG. 8. The high energy data are derived from FIG. 6B and the low energy data are derived from FIG. 7B.

According to embodiments, the observation that the ion energy can affect the profile of the sputtered layer is used to tailor the conformality of the layer and the degree of merger between adjacent structures. A multi-step deposition process includes successive sub-steps of varying ion energies.

In one embodiment, a deposition method includes an initial deposition step at a first ion energy followed by one or more steps of successively higher ion energy. In another embodiment, a deposition method includes an initial deposition step at a first ion energy followed by one or more steps of successively lower ion energy. In various embodiments, the ion energy is increased or decreased by at least 5% between steps, e.g., 10, 20, 50, 100, 150 or 200%, including ranges between any of the foregoing values. The first ion energy may be characterized as a high ion energy (i.e., sputter deposition at a self-bias voltage of at most 90V, e.g., −50 to 90V) or a low ion energy (i.e., sputter deposition at a self-bias voltage of at least 100V, e.g., 100 to 200V). In a particular embodiment, the first ion energy is a low ion energy, which is followed by one or more steps of successively higher ion energies terminating with a high ion energy step. In a further embodiment, the first ion energy is a high ion energy, which is followed by one or more steps of successively lower ion energies terminating with a low (non-zero) ion energy step. Example results from this aggregated, multi-step approach are illustrated in FIGS. 9 and 10.

FIGS. 9A, 10A and 9B, 10B show the as-deposited and post-laser anneal (900° C.) morphologies, respectively, of a conductive layer 500 deposited over raised active regions 310. In the illustrated embodiment, silicon epitaxial raised active region 310 is grown over a fin (not shown) formed on a surface of semiconductor substrate 100. The conductive layer 500 includes a PVD titanium layer 502 deposited on the raised active region 310 and an ALD (18 cycles) titanium nitride capping layer 504 deposited over the titanium layer 502.

Figure 9A:
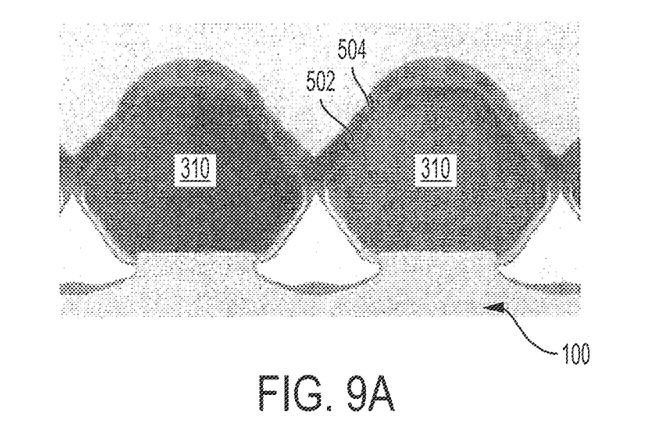
FIGS. 9A and 9B are cross-sectional transmission electron microscope (TEM) micrographs showing the formation of conductive layers over a diamond-shaped epitaxial layer using a two-step ion energy deposition process according to embodiments.
Figure 9B:
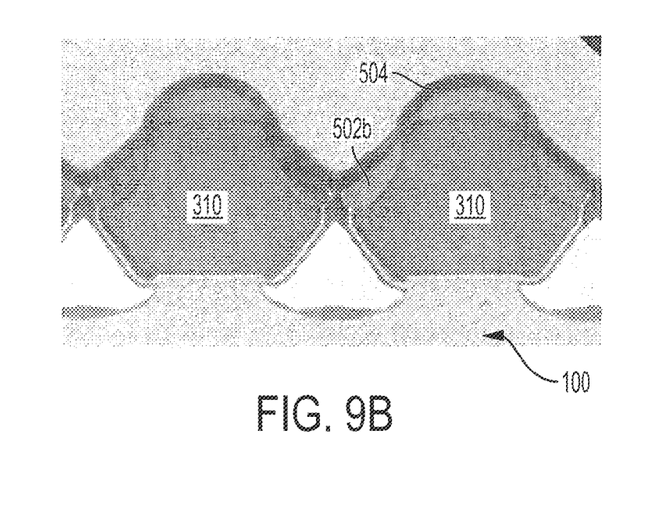
Figure 10A:
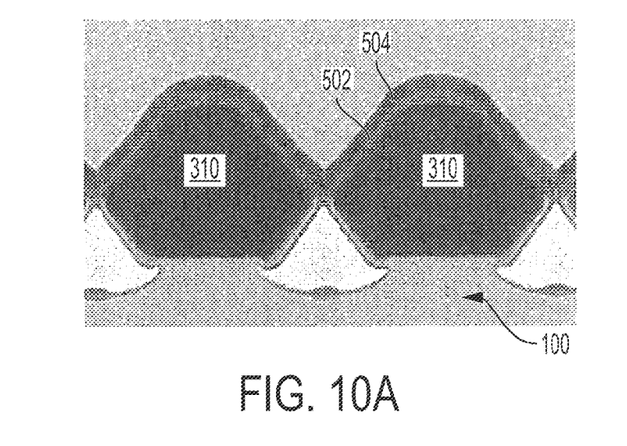
FIGS. 10A and 10B are cross-sectional transmission electron microscope (TEM) micrographs showing the formation of conductive layers over a diamond-shaped epitaxial layer using a two-step ion energy deposition process according to embodiments.
Figure 10B:
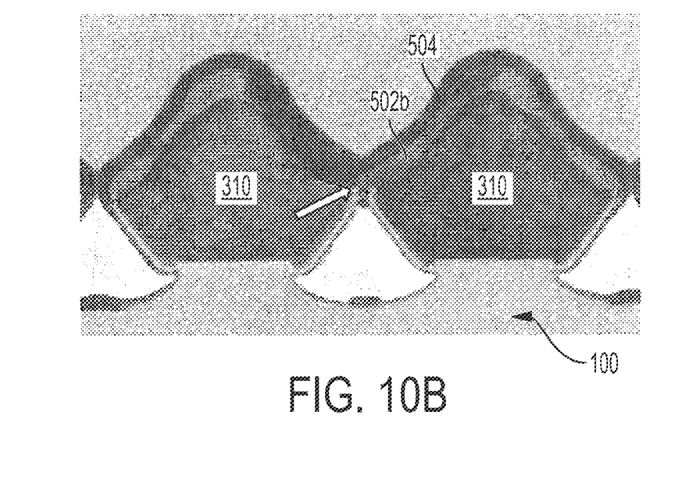

For each of FIGS. 9 and 10, a titanium metal layer 502 is deposited using a two-step process at a constant DC power of 1000 W, and a constant RF power of 4500 W. The target thickness of the deposited titanium layer 502 is 6 nm. For the structure shown in FIG. 9, the first deposition step is at low ion energy (SBV=170V), which is followed by a high ion energy deposition step (SBV=80V). For the structure shown in FIG. 10, the first deposition step is at high ion energy (SBV=80V), which is followed by a low ion energy deposition step (SBV=170V). The duration of each deposition step is 25 seconds.

The post-laser anneal titanium silicide layers 502b formed over adjacent structures where the ion energy increases from a low ion energy to a high ion energy are separate and unconnected (FIG. 9B), while as highlighted by the block arrow, the titanium silicide layers 502b formed over adjacent structures by decreasing the ion energy between successive deposition steps are merged (FIG. 10B) and the epitaxial raised active regions 310 are thus electrically connected.

According to various embodiments, the normalized range $(t_{max}-t_{min}/t_{max})$ of the conductive layer thickness over the top facets of the diamond-shaped structure may be 0.1 to 0.5, i.e., 0.1, 0.2, 0.3, 0.4, 0.45 or 0.5, including ranges between any of the foregoing values.

According to various embodiments, the coefficient of variation of the conductive layer thickness measured at the apex, turn and lateral edge on a facet top surface may be 0.1 to 0.45, i.e., 0.1, 0.2, 0.3 or 0.4, including ranges between any of the foregoing values. The coefficient of variation, also known as the relative standard deviation, is defined as the absolute value of the ratio of the standard deviation to the arithmetic mean of a set of data. For the idealized condition of no thickness variation between the apex, turn and lateral edge, the normalized range and the coefficient of variation are each zero.

Normalized range (R) and coefficient of variation (CV) data are summarized in Table 1 for single-step (comparative), and multi-step depositions according to various embodiments. The conductive layer thicknesses are measured in nm.

TABLE 1

Effect of incident ion energy on conductive layer thickness

| Energy | Var. Cap (#1) | Var. Cap (#2) | Apex | Turn | Lateral | R | CV |
|---|---|---|---|---|---|---|---|
| High* | 10 | — | 11 | 5.92 | 17.7 | 0.67 | 0.51 |
| Low* | 75 | — | 12 | 5.27 | 6.08 | 0.56 | 0.47 |
| High-low | 10 | 75 | 10.8 | 5.5 | 8 | 0.49 | 0.33 |
| Low-high | 75 | 10 | 9.22 | 2.78 | 10.8 | 0.74 | 0.56 |
| Low* | 95 | — | 12.2 | 4.93 | 5.65 | 0.60 | 0.53 |

*Comparative

Disclosed herein are methods to manipulate the conformality of a sputtered thin film. In particular embodiments, control of the conformality can be used to promote or suppress merger of the deposited layer between adjacent three-dimensional structures. In various architectures, merged layers can be used to electrically interconnect discrete structures.

As used herein, the singular forms "a," "an" and "the" include plural referents unless the context clearly dictates otherwise. Thus, for example, reference to a "fin" includes examples having two or more such "fins" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a conductive layer that includes titanium silicide include embodiments where a conductive layer consists essentially of titanium silicide and embodiments where a conductive layer consists of titanium silicide.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed as new is:

1. A method of forming a semiconductor structure comprising:
    forming a plurality of semiconductor fins on a substrate;
    forming a plurality of raised active regions on the semiconductor fins;
    forming a plasma within a vacuum chamber;
    depositing a first portion of a conformal conductive layer over the raised active regions at a first ion energy; and
    depositing a second portion of the conformal conductive layer over the first portion at a second ion energy.

2. The method of claim 1, wherein the first ion energy is less than the second ion energy.

3. The method of claim 2, wherein the conformal conductive layer does not merge adjacent raised active regions.

4. The method of claim 2, wherein a self-bias voltage during deposition of the first portion is from 100 to 200 V.

5. The method of claim 2, wherein a self-bias voltage during deposition of the second portion is from −50 to 90 V.

6. The method of claim 1, wherein the first ion energy is greater than the second ion energy.

7. The method of claim 6, wherein the conformal conductive layer merges adjacent raised active regions.

8. The method of claim 6, wherein a self-bias voltage during deposition of the first portion is from −50 to 90 V.

9. The method of claim 6, wherein a self-bias voltage during deposition of the second portion is from 100 to 200 V.

10. The method of claim 1, wherein the first portion and the second portion each comprise titanium.

11. The method of claim 1, wherein the vacuum chamber pressure is constant during deposition of the conformal conductive layer.

12. The method of claim 1, wherein the power applied to the plasma is constant during deposition of the conformal conductive layer.

13. The method of claim 1, wherein the oxygen concentration within the deposited layer is less than 500 ppm.

14. The method of claim 1, wherein the halide concentration within the deposited layer is less than 500 ppm.

15. A method of forming a semiconductor structure within a vacuum chamber comprising:
    plasma depositing a first portion of a conformal conductive layer over raised regions disposed on a semiconductor substrate at a first ion energy; and
    plasma depositing a second portion of the conformal conductive layer over the first portion at a second ion energy.

16. The method of claim 15, wherein a self-bias voltage during deposition of the first portion is from −50 to 90 V and a self-bias voltage during deposition of the second portion is from 100 to 200 V.

17. The method of claim 15, wherein the vacuum chamber pressure is constant during deposition of the conformal conductive layer.

18. The method of claim 15, wherein the power applied to the plasma is constant during deposition of the conformal conductive layer.

19. A method of forming a semiconductor structure comprising:
    forming a plurality of semiconductor fins on a substrate;
    forming a plurality of raised active regions on the semiconductor fins;
    depositing a first portion of a conductive layer over the raised active regions at a first ion energy; and
    depositing a second portion of the conductive layer over the first portion at a second ion energy, wherein the oxygen concentration within the deposited layer is less than 500 ppm.

* * * * *